United States Patent [19]
Shibayama

[11] Patent Number: 5,583,948
[45] Date of Patent: Dec. 10, 1996

[54] CONNECTING ELEMENT INSPECTING METHOD AND CONNECTING ELEMENT INSPECTING DEVICE

[75] Inventor: Kouichi Shibayama, Yokkaichi, Japan

[73] Assignee: Sumitomo Wiring Systems, Ltd., Yokkaichi, Japan

[21] Appl. No.: 321,671

[22] Filed: Oct. 12, 1994

[30] Foreign Application Priority Data

Oct. 18, 1993 [JP] Japan ................................. 5-260232

[51] Int. Cl.⁶ ............................................. G06K 9/00
[52] U.S. Cl. ........................... 382/141; 348/86; 348/125
[58] Field of Search ................................... 382/141, 143, 382/144, 145, 146, 147, 149, 152; 348/86, 87, 92, 125, 126, 131

[56] References Cited

U.S. PATENT DOCUMENTS

| | | | |
|---|---|---|---|
| 4,277,175 | 4/1981 | Karasaki et al. | 356/378 |
| 4,799,268 | 1/1989 | McLean et al. | 382/146 |
| 5,220,617 | 6/1993 | Bird et al. | 382/149 |
| 5,353,357 | 10/1994 | Longest, Jr. et al | 382/141 |

FOREIGN PATENT DOCUMENTS

| | | | |
|---|---|---|---|
| 0429739A1 | 6/1991 | European Pat. Off. | G01R 31/308 |
| 0510887A2 | 10/1992 | European Pat. Off. | G01R 31/308 |
| 0562614A2 | 9/1993 | European Pat. Off. | G01R 31/308 |
| 2937929 | 11/1980 | Germany | G01R 31/308 |
| 62-47093 | 12/1987 | Japan | G01R 31/04 |

OTHER PUBLICATIONS

T. Ninomiya et al., "Automatic 2½D Shape Inspection System for Via–Hole Fillings of Green Sheets by Shadow Image Analysis" IEEE pp. 515–520 1989.

Primary Examiner—Leo Boudreau
Assistant Examiner—D. Richard Anderson, Jr.
Attorney, Agent, or Firm—Beveridge, DeGrandi, Weilacher & Young, LLP

[57] ABSTRACT

The connecting element inspecting method inspects a connector having a connecting surface to another connector paired with the connecting element and a plurality of terminal containing holes opening to the connecting surface for respectively containing terminals. The connecting surface is irradiated by light entering the terminal containing holes. The connecting surface is imaged obliquely from a television camera. The percentage of the area of a portion occupied by the terminal in an image region associated with the terminal containing hole to be inspected is found. It is judged whether or not the terminal is properly mounted in the terminal containing hole to be inspected on the basis of the found percentage of the area. Consequently, it is judged whether the connector is accepted or rejected.

35 Claims, 11 Drawing Sheets

CONNECTING ELEMENT INSPECTING METHOD AND CONNECTING ELEMENT INSPECTING DEVICE

CROSS REFERENCE TO RELATED APPLICATION

This application claims priority benefits under 35 USC §119 of Japanese Patent Application Serial No. 5-260232, the disclosure of which is incorporated by reference.

BACKGROUND OF THE INVENTION

1. Field of the Invention

The present invention relates to a connecting element inspecting method and a connecting element inspecting device for detecting a state where terminals are mounted in terminal containing holes, inclusion of foreign materials into the terminal containing holes, and the like in a connecting element such as a connector or a socket and judging whether the connecting element is accepted or rejected.

2. Description of the Related Art

In a connecting element, for example, a connector, a terminal has been conventionally inserted into a terminal containing hole opening to a connecting surface to another connector to a predetermined position from the rear thereof. In the connector, the terminal is generally held in the predetermined position by a lance provided on the side of a connector housing or on the side of the terminal.

A lot of connectors fabricated include one in which a terminal is not inserted to the above described predetermined position. Such a connector must be eliminated by inspection.

Therefore, examples of a conventionally known inspecting device for inspecting a connector include one so adapted as to elastically push a front end of a terminal by a pin elastically urged by a spring and mechanically push out the terminal incompletely inserted and then, check the conduction of the terminal (see Japanese Utility type Laid-Open Gazette No. 47093/1987).

There exists a connector in a so-called half-inserted state in which a terminal is not completely inserted to a predetermined position, although it is engaged with a connector housing in such a extent that it receives an engaging force at a certain level by a lance. When such a connector in a half-inserted state is inspected by the above described inspecting device, the terminal can be generally pushed out by an urging force produced by a pin. If each electric wire is bound by tape winding or the like, however, the terminal cannot be pushed out by the urging force produced by the pin, so that the connector passes the check of the conduction. When this connector is actually connected to another connector, the terminal is pushed out by a corresponding terminal in the other connector or the terminal is moved by causes such as vibration during its use, so that the connector is incompletely connected.

In the above described inspecting device, therefore, it is considered that the urging force of the spring for urging the pin is increased. In this case, however, the terminal is deformed, plating on the surface of the terminal is stripped and therefore, the connector housing is damaged.

With the progress of electronic control in automobiles, a connector used for a wiring harness in each of the automobiles has been made multipolar and miniaturized in recent years. When an attempt to inspect such a small-sized and multipolar connector is made using the above described inspecting device, the above described pin cannot be inserted into a terminal containing hole because the terminal containing hole is very narrow. In addition, even if the pin can be inserted, a too large pressing force cannot be exerted on a small-sized terminal which is easily deformed, thereby to make it impossible to detect a half-inserted state.

On the other hand, it is also considered that a state where a terminal is mounted is judged by visual verification of human beings. In this case, however, the inspection efficiency is significantly low, and the inspection precision varies. Further, it cannot be possible to detect a half-inserted state of the terminal (a state where the position of the terminal is shifted by approximately 0.2 to 0.3 mm from its correct inserted state).

SUMMARY OF THE INVENTION

The present invention has been made in view of the foregoing problems and has for its object to provide a connecting element inspecting method and a connecting element inspecting device which can inspect a connecting element efficiently and with high precision without damaging a terminal or the like and is also applicable to a small-sized and multipolar connecting element.

In order to attain the above described object, in a preferred embodiment of the present invention, there is provided a connecting element inspecting method for inspecting a connecting element having i) a connecting surface to face a connector to be paired with the connecting element, ii) a plurality of terminal containing holes opening to the connecting surface, and iii) terminals respectively inserted into the predetermined terminal containing holes in a predetermined direction of insertion and contained therein, comprising the steps of inputting image data of the connecting surface obtained using light reflected in a direction intersecting the predetermined direction of insertion from the connecting surface, setting an image region to be inspected in relation to the predetermined terminal containing hole to be inspected on the basis of the image data, calculating a percentage of the area of a portion occupied by the terminal in the image region to be inspected, and judging whether the connecting element is accepted or rejected in relation to the predetermined terminal containing hole to be inspected depending on whether or not the percentage satisfies predetermined judgment conditions.

According to the present embodiment, the image region to be inspected in relation to the terminal containing hole to be inspected is set, and the percentage of the area of the portion occupied by the terminal in the image region to be inspected is found. It is judged that the connecting element to be inspected is rejected on the basis of the found percentage of the area. The above described rejection is caused by the reasons such as the reason that the terminal is not properly mounted, for example, the terminal slips off and the terminal is half-inserted and the reason that foreign materials enter the terminal containing hole. In the conventional method of checking the conduction with a conductor being brought into elastic contact with the terminal, the half-inserted state of the terminal cannot be detected. In the present embodiment in which inspection is made in image processing, however, the half-inserted state of the terminal can be also detected, so that the detection precision is high. In addition, it is possible to inspect the connecting element very efficiency without damaging the terminal. Further, the present invention is also applicable to a small-sized and multipolar connecting element. Particularly, the light reflected in the direction intersecting the direction of insertion of the terminal from the connecting surface is used, thereby to make it possible to reliably detect the shift in the position of the terminal in the direction of insertion or the direction opposite to the direction of insertion.

In another preferred embodiment of the present invention, there is provided element inspecting device for inspecting a connecting element having i) a connecting surface to face a connector to be paired with the connecting element, ii) terminal containing holes opening to the connecting surface, and iii) terminals respectively inserted into the predetermined terminal containing hole in a predetermined direction of insertion and contained therein, comprising light irradiating means for irradiating the connecting surface to the connecting element by parallel light entering the terminal containing holes, imaging means so disposed that light reflected in a direction intersecting the predetermined direction of insertion from the connecting surface can be received for imaging the connecting surface using the reflected light, image region setting means for setting an image region to be inspected in relation to the predetermined terminal containing hole to be inspected on the basis of image data from the imaging means, percentage calculating means for calculating the percentage of the area of a portion occupied by the terminal in the image region to be inspected, and judging means for judging whether the connecting element is accepted or rejected in relation to the predetermined terminal containing hole to be inspected depending on whether or not the percentage satisfies predetermined judgment conditions.

According to the present embodiment, the connecting surface is imaged using the parallel light by the light irradiating means, thereby to make it possible to obtain an image high in position precision, so that the inspection precision is high. In addition, the connecting surface is imaged from the direction intersecting the direction of insertion of the terminal, thereby to make it possible to reliably detect the shift in the position of the terminal in the direction of insertion or the direction opposite to the direction of insertion, so that the inspection precision can be further improved. Consequently, it is possible to also detect the half-inserted state of the terminal. Further, it is possible to inspect the connecting element very efficiently without damaging the terminal. Further, the present invention is also applicable to a small-sized and multipolar connecting element.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Embodiments will be described in detail with reference to attached drawings.

Figure 2:
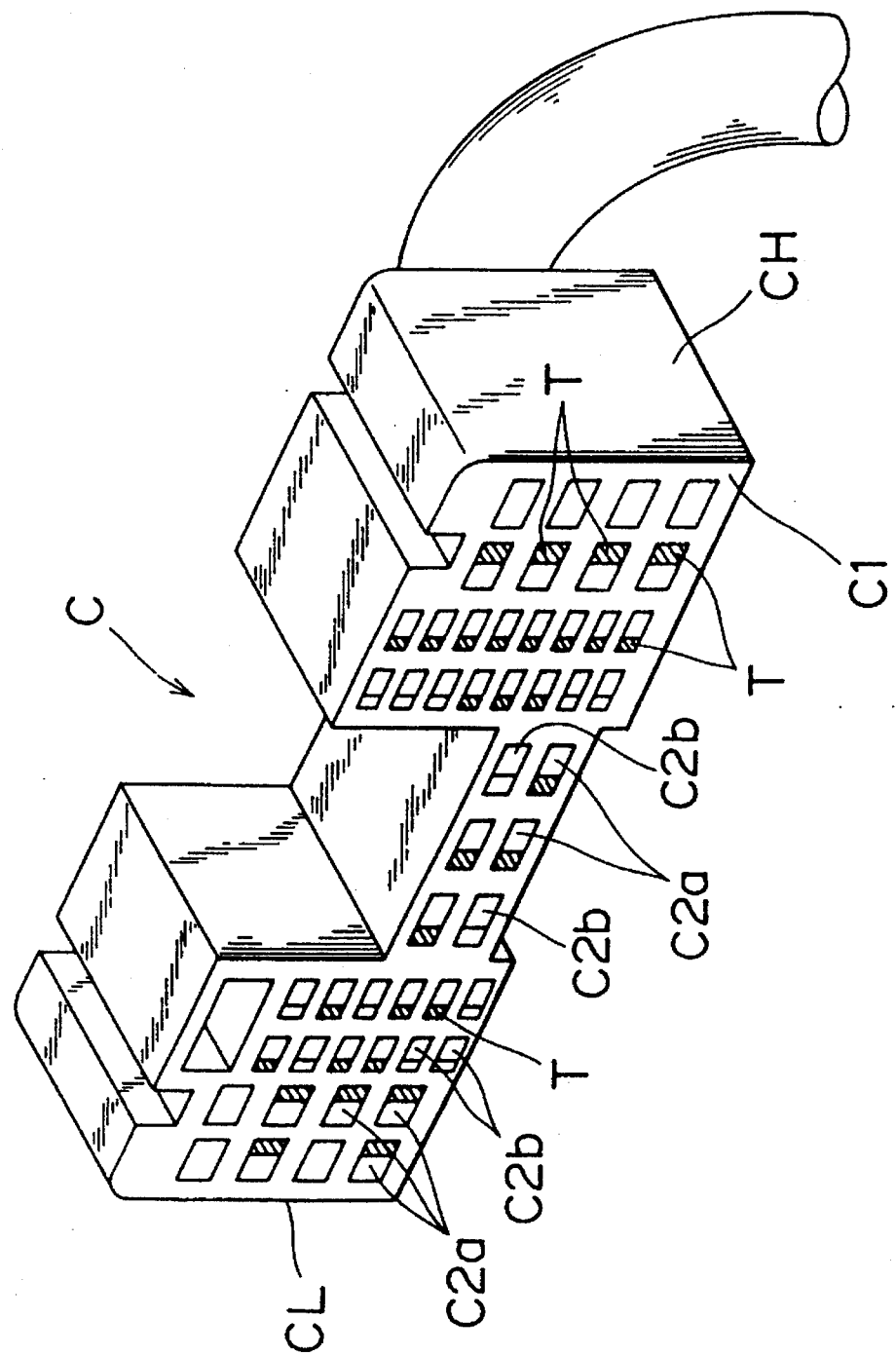
FIG. 2 is a perspective view showing a connector serving as a connecting element (where terminal portions are hatched)
Figure 3:
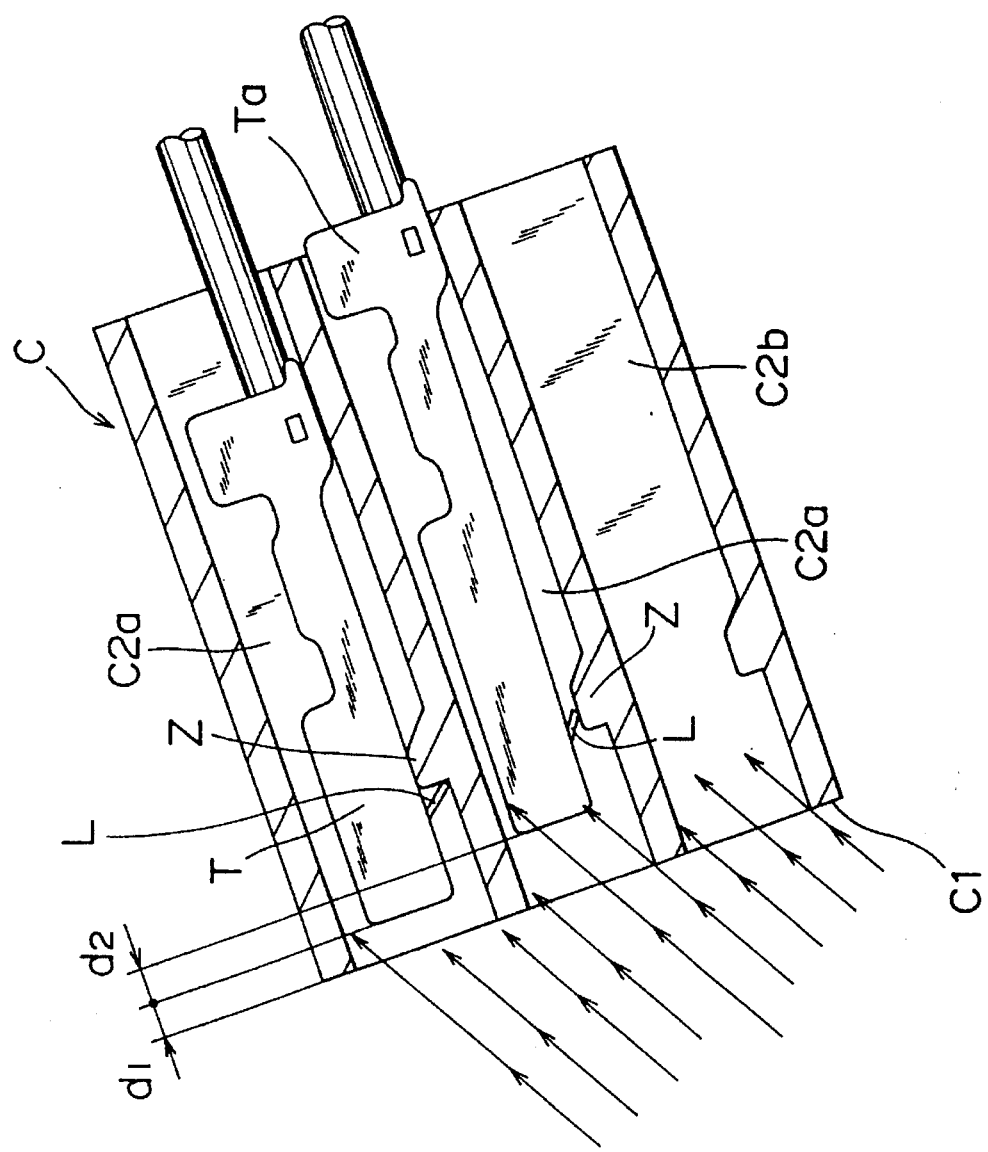
FIG. 3 is a vertical sectional view of main parts of a connector showing a state where terminals are inserted.

Referring to FIGS. 2 and 3, an end surface of a housing CH of a connector C is constructed as a connecting surface C1 which is to face a corresponding connector (not shown), and a plurality of terminal containing holes C2 disposed crosswise open to the connecting surface C1. A plurality of types of specifications which are judged depending on the type and the number of poles are set in the connector C. The plurality of terminal containing holes C2 are divided into terminal containing holes C2a each set so as to contain a terminal T by inserting the terminal T from the rear of the housing CH (terminal containing holes in the upper stage in FIG. 3) and terminal containment holes C2b each set so as to avoid containing a terminal T (terminal containing holes in the lower stage in FIG. 3) depending on the respective specifications.

Figure 4:
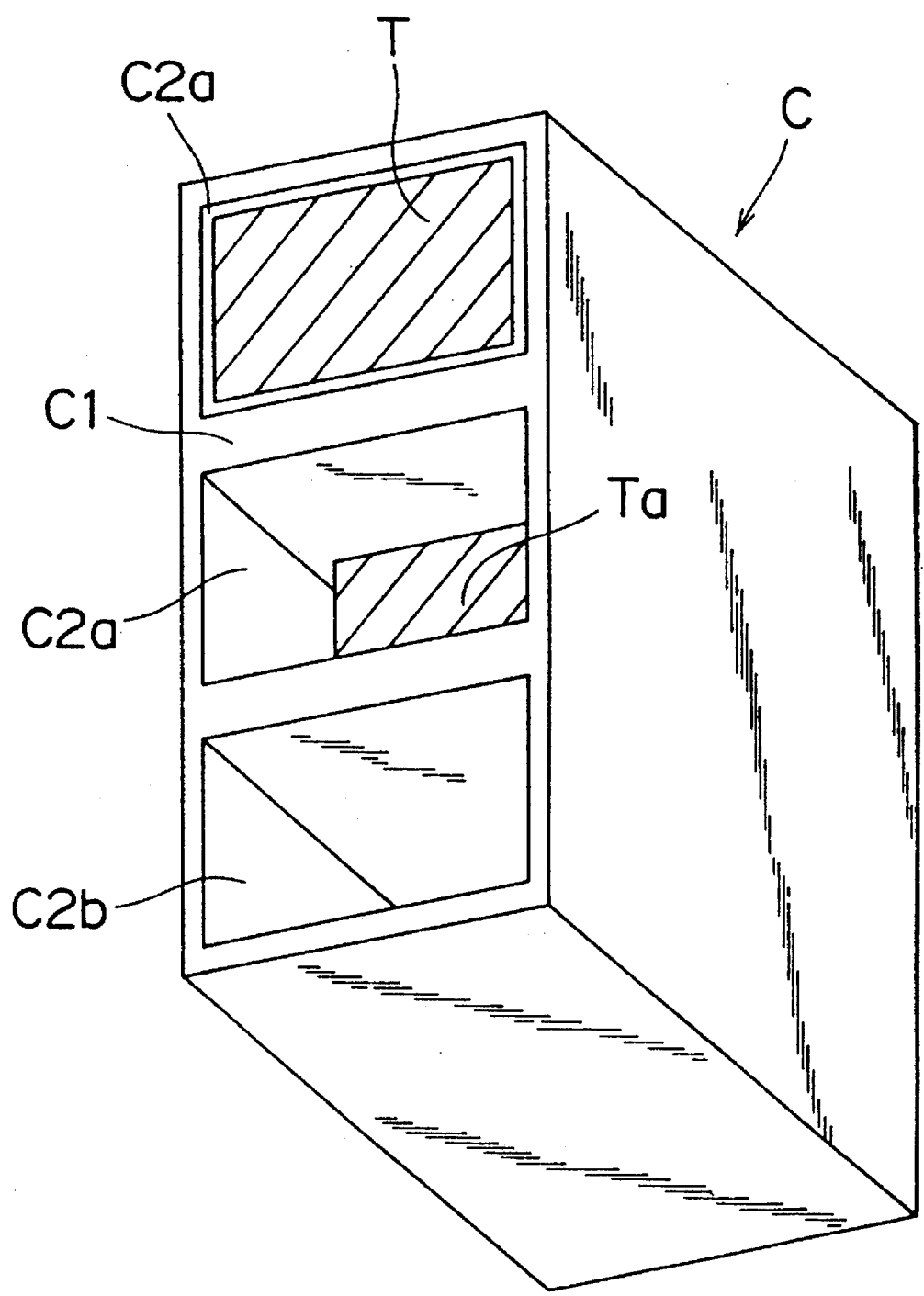
FIG. 4 is a perspective view showing the main parts of the connector as viewed obliquely from below (where terminal portions are hatched)

Referring to FIGS. 3 and 4, a state where a front end of the terminal T retreats from the connecting surface C1 by a distance $d_1$ is a state where the terminal is properly mounted. In this state, a lance L is engaged with an engaging projection Z of the housing CH. If the lance L is not engaged or incompletely engaged, the terminal T is not properly mounted. In FIGS. 3 and 4, the terminal T in the upper stage is properly mounted, and a terminal Ta in the middle stage is not properly mounted. A so-called "half-inserted state" of the terminal T is a state where the lance L is not completely engaged with the engaging projection Z, and a front end of the terminal Ta retreats from its proper position by a distance $d_2$ of approximately 0.2 to 0.3 mm. In FIG. 4, a portion occupied by the terminal T is hatched. Referring to FIG. 4, when the terminal Ta is not properly mounted and retreats, a large part of the inner surface of the terminal containing hole C2a can be seen by the amount of the retreat of the terminal Ta. Specifically, a portion occupied by the terminal Ta is relatively narrowed. In the present invention, it is judged that the terminal is not properly mounted on the basis of the percentage of the area of the portion occupied by the terminal Ta in a certain region in view of the principle. Although one example of a so-called metal lance type in which the lance L is formed on the side of the terminal T is illustrated in FIG. 3, a housing lance type in which the lance L is formed on the side of the housing CH may be used.

Figure 1:
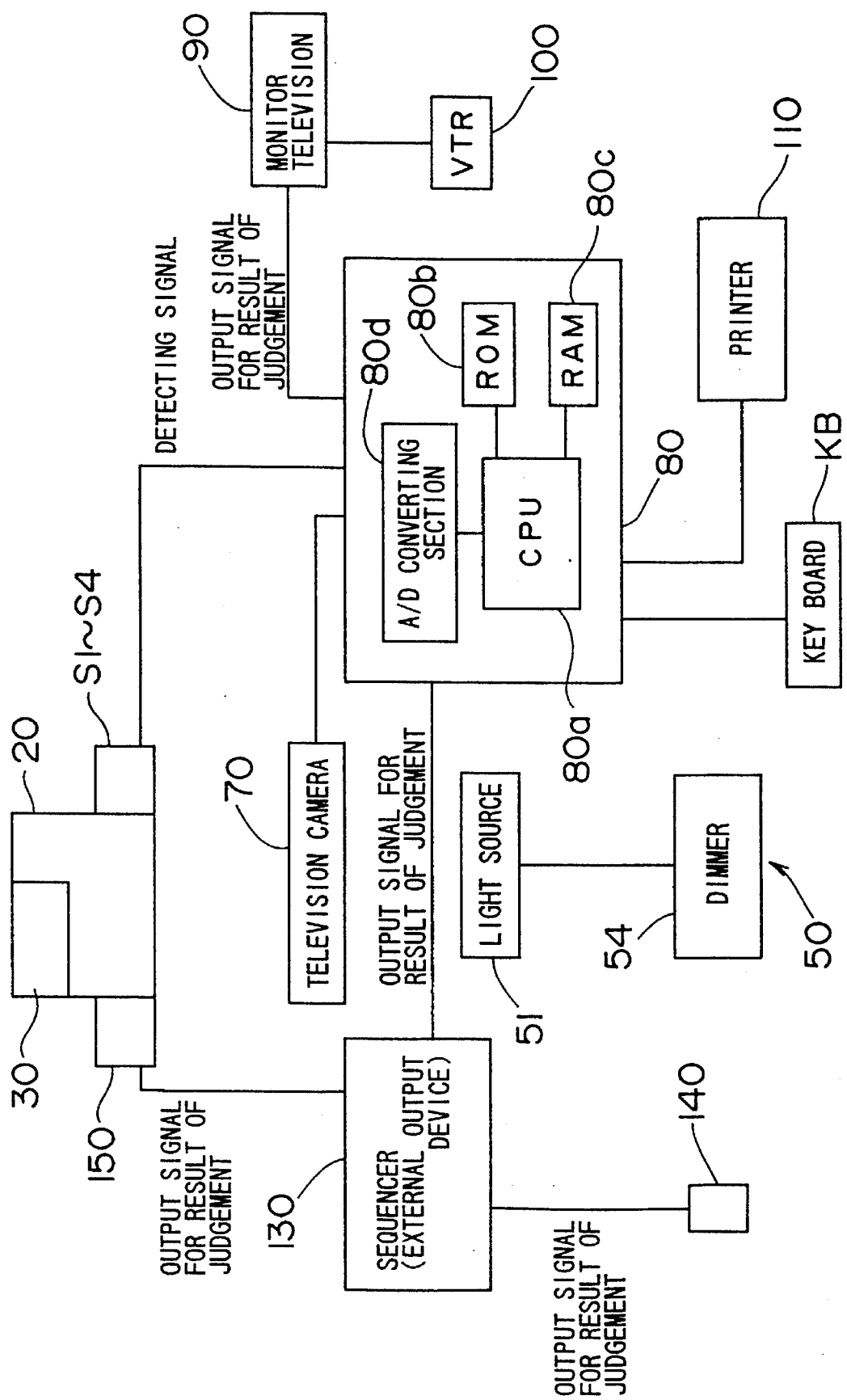
FIG. 1 is a block diagram showing the schematic construction of a connecting element inspecting device according to one embodiment of the present invention.
Figures 5, 5A:
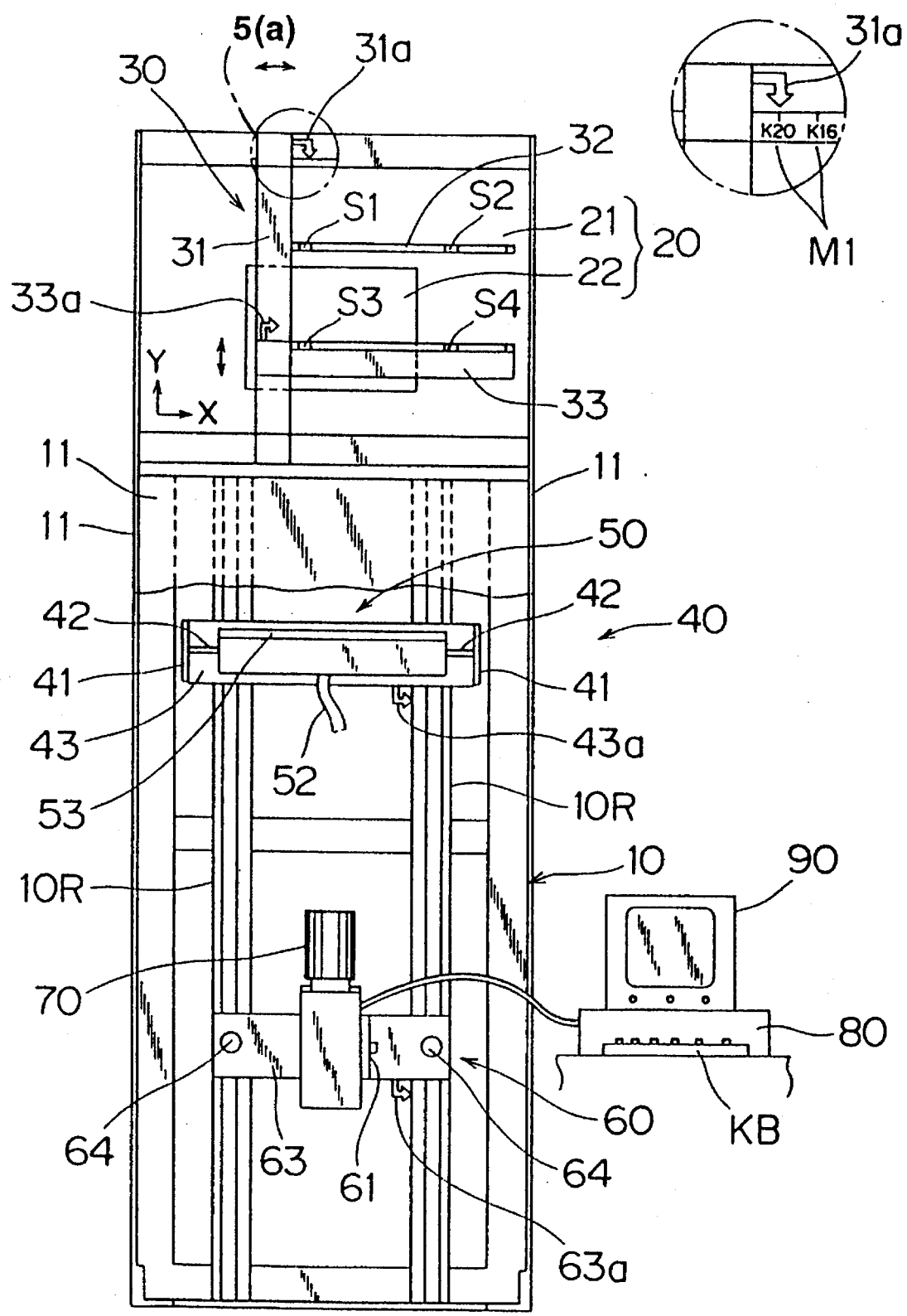
FIG. 5 is a schematic front view showing the inspecting device.
Figure 6:
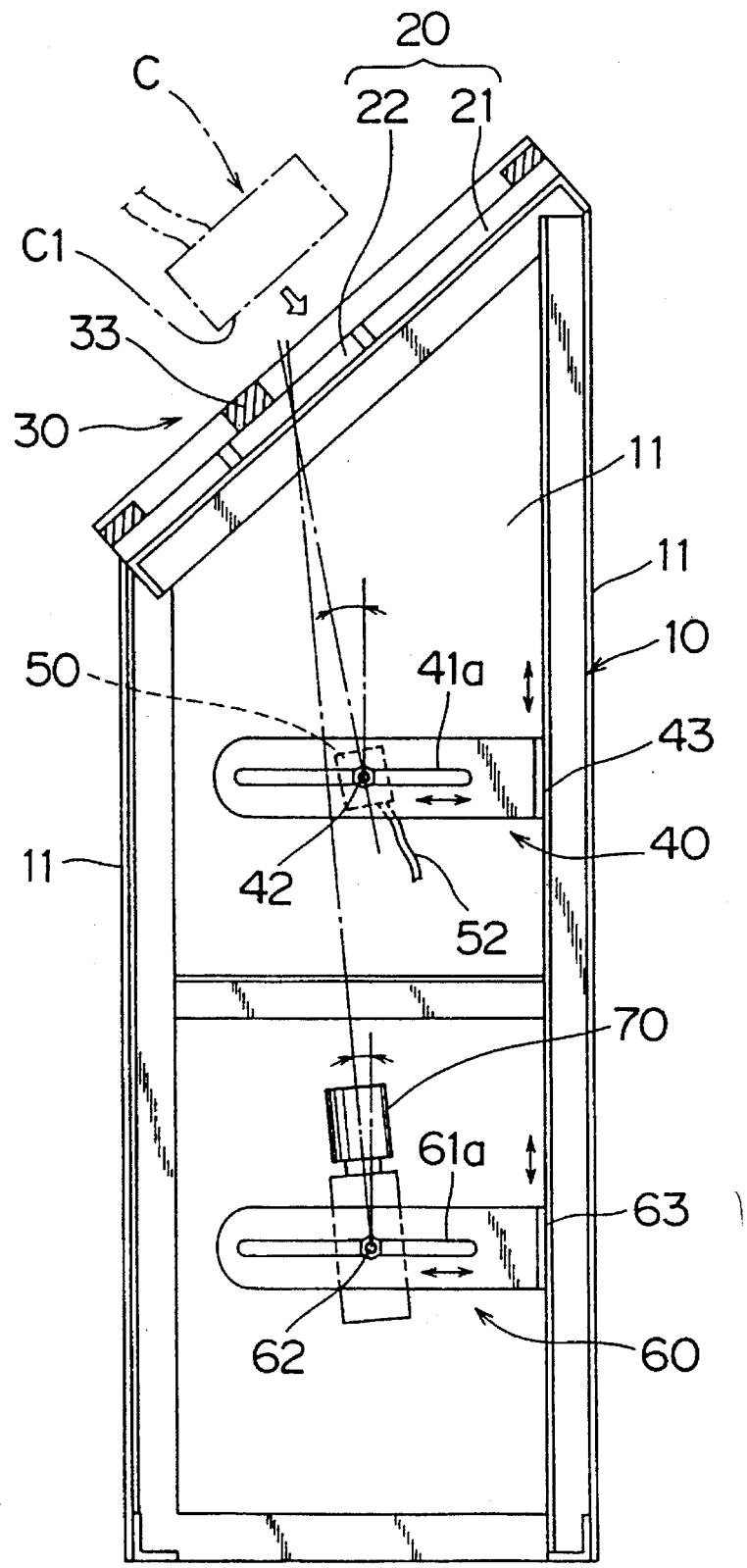
FIG. 6 is a schematic side view showing the inspecting device.

Referring to FIG. 1, FIG. 5 which is a schematic front view showing the inspecting device and FIG. 6 which is a schematic side view showing the inspecting device, the inspecting device comprises (1) a frame 10 fixed to a floor surface, (2) a mounting plate 20 fixed to an upper part of the frame 10 and composed of an inclined plate on which a connecting surface C1 of a connector C is mounted, (3) a positioning device 30 for positioning the connector C in a predetermined position on the mounting plate 20, (4) a light irradiating device 50 supported by the frame 10 through an adjusting device 40 below the mounting plate 20 for irradiating the connecting surface C1 of the connector C by parallel light, (5) a television camera 70 serving as two-dimensional imaging means which is supported by the frame 10 through an adjusting device 60 below the mounting plate for imaging the connecting surface C1, and (6) a computer 80 for processing an image signal from the television camera 70 and judging whether the connector C is accepted or rejected.

Referring to FIG. 1, the above described computer 80 has a CPU 80a for controlling respective equipments connected thereto, a ROM (Read Only Memory) 80b storing programs executed by the CPU 80a, and a RAM (Random Access Memory) 80c used as a work area, for example, of the CPU 80a. In addition, the computer 80 has an analog-to-digital (A/D) converting section 80d, and the television camera 70 is connected to the computer 80 through the A/D converting section 80d. The image signal from the television camera 70 is converted into a digital signal serving as luminance information for each pixel by the A/D converting section 80d, and the digital signal is inputted to the CPU 80a.

A monitor television 90 for displaying a binary image of the connecting surface C1 and the result of the inspection is connected to the computer 80, and a VTR (Video Tape Recorder) 100 is connected to the monitor television 90. In addition, a printer 110 for outputting the binary image and the result of the inspection is connected to the computer 80.

Furthermore, a sequencer 130 serving as an external output device is connected to the computer 80. The sequencer 130 carries out sequence control of a buzzer 140 for reporting the result of the inspection by a buzzing sound and a stamper 150 for placing on the connector C which is judged to be an acceptable product a stamp indicating that the connector C is an acceptable product on the basis of an output of the result of the inspection from the computer 80. The stamper 150 is provided in a predetermined portion of the positioning device 30, which is not illustrated.

Referring to FIGS. 5 and 6, the above described frame 10 has a structure in which a plurality of angle bars are combined, and its side surfaces are covered with a blackout curtain 11 for interrupting light from the exterior. In addition, a pair of supporting rails 10R for movably supporting sliding plates 43 and 63, as described later in the respective adjusting devices, 40 and 60 is fixed to the frame 10.

The above described mounting plate 20 is such that a transparent glass plate 22 is fitted in an opening provided in the center of an aluminum plate 21, and the connector C is mounted on a portion of the glass plate 22 with the connecting surface C1 being directed downward.

The above described positioning device 30 comprises on the upper surface of the mounting plate 20 shown in FIG. 5 (1) a movable X-axis cursor 31 slidable in the direction of the X-axis on the mounting plate 20, (2) a fixed Y-axis cursor 32 having its end fixed to a portion slightly above the center of the movable X-axis cursor 31 and extending in the direction of the X-axis, and (3) a movable Y-axis cursor 33 having its end supported slidably in the direction of the Y-axis on the movable X-axis cursor 31 below the fixed Y-axis cursor 32 and extending in the direction of the X-axis.

A first connecting element detecting sensor S1 is fixed to the fixed Y-axis cursor 32 in a position in the vicinity of the movable X-axis cursor 31, and a second connecting element detecting sensor S2 is slidably supported thereon. In addition, a third connecting element detecting sensor S3 is fixed in a position in the vicinity of the movable X-axis cursor 31 to the movable Y-axis cursor 33, and a fourth connecting element detecting sensor S4 is slidably supported thereon.

An arrow 31a is fixed to an upper end of the movable X-axis cursor 31. On the other hand, marks M1 for indicating the specifications (the type, the number of poles and the like) of the connector C are assigned to a plurality of portions in an upper end of the mounting plate 20. The movable X-axis cursor 31 is so moved in the direction of the X-axis that the arrow 31a coincides with the type or the like of the connector C to be inspected, thereby to make it possible to easily set the movable X-axis cursor 31 in its proper position.

Similarly, an arrow 33a is fixed to a base end of the movable Y-axis cursor 33. On the other hand, marks (not shown) for indicating the type, the number of poles, and the like of the connector C are assigned to a plurality of portions on the upper surface of the movable X-axis cursor 31. The movable Y-axis cursor 33 is so moved in the direction of the Y-axis that the arrow 33a coincides with the type or the like of the connector C to be inspected, thereby to make it possible to easily set the movable Y-axis cursor 33 in its proper position.

Both the movable cursors 31 and 33 can be easily set in the proper positions, thereby to make it possible to easily position and set the connector C to be inspected along both the movable cursors 31 and 33 in a predetermined position.

Each of the movable connecting element detecting sensors S1 to S4 is a known optical sensor comprising a light emitting portion and a light receiving portion, and determines whether or not the connector C to be inspected is set. The positions of the movable connecting element detecting sensors S2 to S4 out of the connecting element detecting sensors S1 to S4 are made to coincide with positions adapted to the connector C to be inspected by making the arrows S2a and S4a which are moved along with the sensors S2 and S4 coincide with marks (not shown). The connecting element detecting sensors S1 to S4 output their detection signals to the computer 80, and the computer 80 starts inspection in response to the detection signals.

The above described light irradiating device 50 is of known construction which introduces light from a light source 51 composed of a halogen lamp or the like by a lot of optical fibers 52 and aligns front ends of the optical fibers on a line as a light irradiating section 53. In addition, a power supply unit (not shown) of the light source 51 and a dimmer 54 are connected to the light irradiating device 50.

The above described adjusting device 40 adjusts the angle of irradiation by the light irradiating device 50 and the distance between the light irradiating section 53 and the connector C. The adjusting device 40 comprises (1) a pair of first supporting arms 41, which are horizontal, having its base end supported slidably up and down on the supporting rail 10R through the sliding plate 43, and (2) a pair of second supporting arms 42 holding both ends of the light irradiating section 53 and supported on a long groove 41a formed in each of the first supporting arms 41 slidably and rotatably. The vertical position of the first supporting arm 41 can be fixed by a screw (not shown). An end of the second supporting arm 42 is formed into a male screw, and a nut (not shown) is fastened to the male screw so that the end of the second supporting arm 42 is fixed to a desired angle of rotation of the second supporting arm 42. Consequently, the light irradiating device 50 is adjusted to an angle of irradiation suitable for the connector C.

Furthermore, an arrow 43a is fixed to a predetermined portion of the sliding plate 43. On the other hand, marks (not shown) for displaying the specifications (the type, the number of poles and the like) of the connector C are assigned to a plurality of portions on the side surfaces of the supporting rail 10R. The vertical position of the sliding plate 43 is so determined as to make the arrow 43a coincide with the above described marks. Consequently, the light irradiating device 50 is adjusted to an irradiation distance suitable for the connector C.

The television camera 70 serving as the two-dimensional imaging means is composed of a known CCD camera or the like. The television camera 70 images the connecting surface C1 obliquely such that the shift in the position of the terminal can be detected. The positional relationship between the television camera 70 and the light irradiating section 53 is so set that the television camera 70 can avoid regular reflected light from the connecting surface C1 and receive only diffused reflected light. This is for avoiding the difficulty in detecting the difference in the lightness which arises in image processing for judging whether the connector C is accepted or rejected because the amount of light is too large if the regular reflected light is received. FIG. 6 shows one example of a preferred relationship wherein a central axis of camera 70 and of light irradiating section 53 intersect at an acute angle.

The above described adjusting device 60 adjusts the angle of imaging of the television camera 70 and the distance of the television camera 70 from the connector C, which is of the same construction as the adjusting device 40 for the light irradiating device 50.

The above described adjusting device 60 comprises a first supporting arm 61 having its base end supported slidably up and down on the supporting rail 10 through a sliding plate 63 and a second supporting arm 62 holding the television camera 70 and supported slidably and rotatably on a long groove 61a formed in the first supporting arm 61. The position of the first supporting arm 61 can be fixed by screws 64. An end of the second supporting arm 62 is formed into a male screw, and a nut (not shown) is fastened to the male screw so that the end of the second supporting arm 62 is fixed to a desired angle of rotation of the second supporting arm 62. Consequently, the light irradiating device 50 is adjusted to an angle of irradiation suitable for the connector C.

Furthermore, an arrow 63a is fixed to a predetermined portion of the sliding plate 63. On the other hand, marks (not shown) for indicating the specifications (the type, the number of poles and the like) of the connector C are assigned to a plurality of portions on the side surfaces of the supporting rail 10R. The vertical position of the sliding plate 63 is so determined as to make the arrow 63a coincide with the marks. Consequently, the light irradiating device 50 is adjusted to an irradiation distance suitable for the connector C.

In control carried out by the CPU 80a, image data in a predetermined portion of the connecting element C is binary-coded, thereby to extract only a predetermined characteristic portion so that an image region to be inspected of the connector C to be inspected is set on the basis of the coordinates of the characteristic portion. For example, one external shape contour segment CL (see FIG. 7) serving as a characteristic portion of the housing CH of the connector C is extracted, and a coordinate axis corresponding to the set connector C is set on the basis of the contour segment CL. An image region to be inspected (to be processed) is determined on the basis of the coordinate axis (not shown). Specifically, the shift in the position of the connector C to be inspected is corrected on an image.

Figure 7:
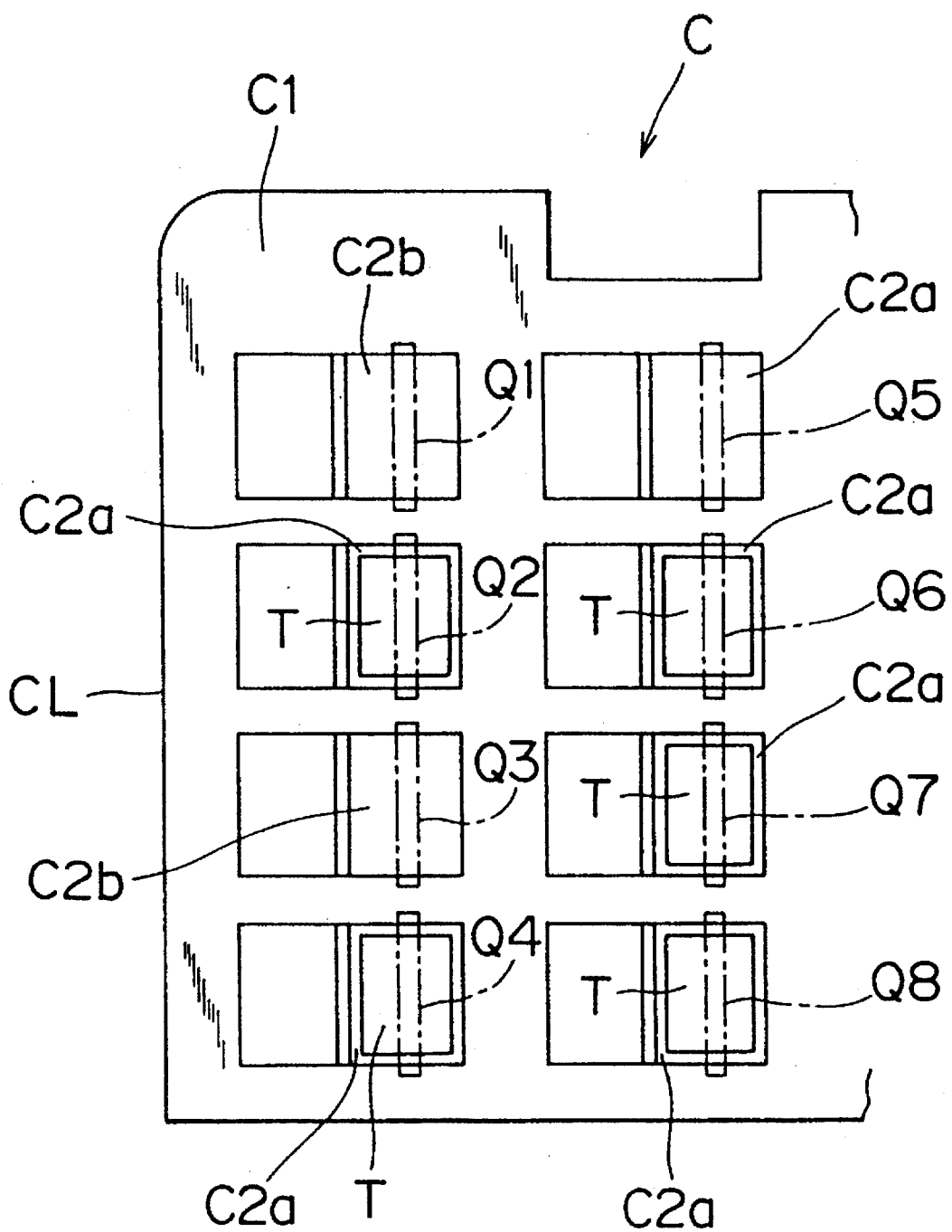
FIG. 7 is a front view of main parts of a connecting surface of the connector which describes image regions set.

Furthermore, in the above described control, the specifications (the type, the number of poles and the like) of the connector C to be inspected are inputted through a keyboard KB serving as specification inputting means so that inspection conditions are set depending on the inputted specifications. Referring to FIG. 7, the above described inspection conditions include image regions Q1, Q2, . . . respectively associated with a plurality of terminal containing holes C2 in which terminals T are to be contained in the connector C to be inspected, the order of processing of the image regions Q1, Q2, . . . , and judgment conditions in each of the image regions Q1, Q2, . . .

Furthermore, each of the set image regions Q1, Q2, . . . is a region which is sufficient to find the percentage of the area of the terminal T and a region narrower than the whole of the terminal containing hole C2, thereby to make it possible to improve the processing speed. As shown in FIG. 7, the narrower region (e.g., Q1) can be directed at a center portion so as to exclude two side portions of the terminal containing holes. Each of the above described image regions Q1, Q2, . . . can be a region where the percentage of the area of the terminal T is changed even if the terminal T only slightly comes off by aiming at only a terminal portion. In FIG. 7, the image region Q5 to be inspected is an image region associated with the terminal containing hole C2 which is judged to be rejected because no terminal is contained therein.

As shown in FIG. 7, in the above described control, if the inputted specifications include terminal containing holes C2b each set so as to avoid containing a terminal, inspection conditions are so set that image regions associated with the terminal containment holes C2b each set so as to avoid containing a terminal (image regions Q1 and Q3 in FIG. 7) are excluded from the order of processing.

Furthermore, in this case, processing conditions are so set as to confirm that the terminals T are not contained in the image regions associated with the terminal containment holes C2b each set so as to avoid containing a terminal (Q1 and Q3 in FIG. 7) when there exist similar specifications which differ from the above described inputted specifications only in that the terminals T are contained in the terminal containment holes C2b each set so as to avoid containing a terminal (in the similar specifications, the terminal containing holes associated with the image regions Q1 and Q3 in FIG. 7 become terminal containment holes each set so as to avoid containing a terminal). Specifically, the image regions associated with the terminal containing holes C2b each set so as to avoid containing a terminal are set as image regions to be inspected, and the above described confirmation is performed by setting judgment conditions that it is accepted that no terminals T are contained in the image regions associated with the terminal containment holes C2b each set so as to avoid containing a terminal.

Figure 8:
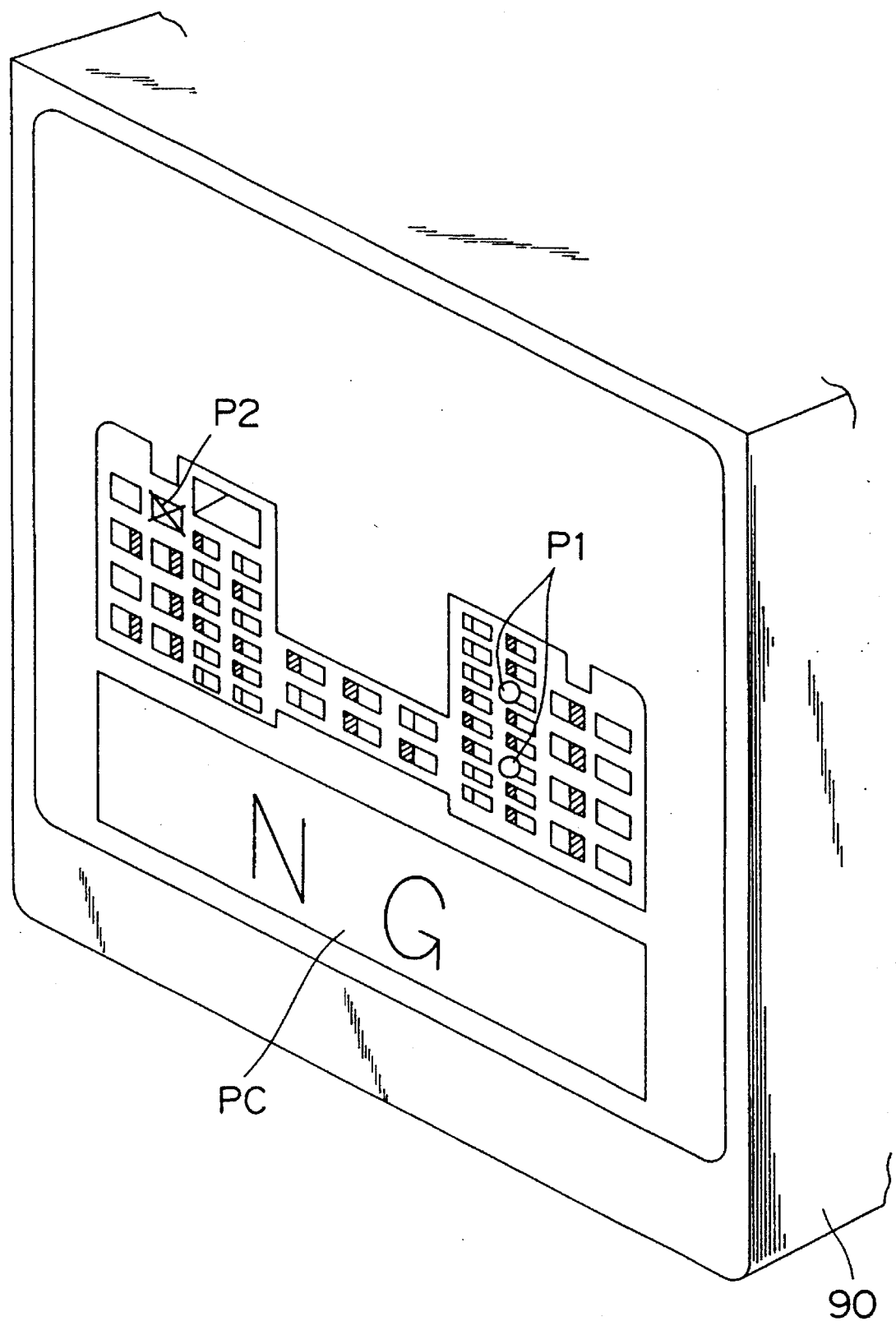
FIG. 8 is a schematic perspective view showing a monitor for displaying the result of the judgment, for example.

Furthermore, information related to the result of the judgment of the connector C is displayed on a screen of the monitor television 90, as shown in FIG. 8. Specifically, as an indication PC for indicating whether the connector C is accepted or rejected, "OK" is displayed if the connector C is accepted, while "NG" is displayed if the connector C is rejected. In addition, a white circle, for example, is given to the terminal containing hole C2a which is rejected as an indication P that the terminal containing hole C2a is rejected in an image of the connecting surface C1 of the connector C displayed on the monitor television 90. On the other hand, if the terminal is inserted into the terminal containment hole C2b in which the terminal should not be inserted and foreign materials are inserted thereto, an "X mark", for example, is given as an indication P2 to the position.

Procedure for inspection

Description is now made of the procedure for inspection.

The height-position of the light irradiating device 50 and the direction of the light irradiating section 51 are adjusted by the adjusting device 40 as preparation for inspection, to so set the angle of irradiation and the irradiation distance as to be adapted to the connector C to be inspected. On the other hand, the height-position and the direction of the television camera 70 are adjusted by the adjusting device 60, to so set the angle of imaging and the imaging distance as to be adapted to the connector C.

Furthermore, the movable cursors 31 and 33 in the positioning device 30 are slid to positions which are adapted to marks M1 such as the type, the number of poles, and the like in the connector C to be inspected, and the connecting element detecting sensors S2 and S4 in the fixed Y-axis cursor 32 and the movable Y-axis cursor 33 are moved to required positions which are adapted to the connector C.

Figure 9:
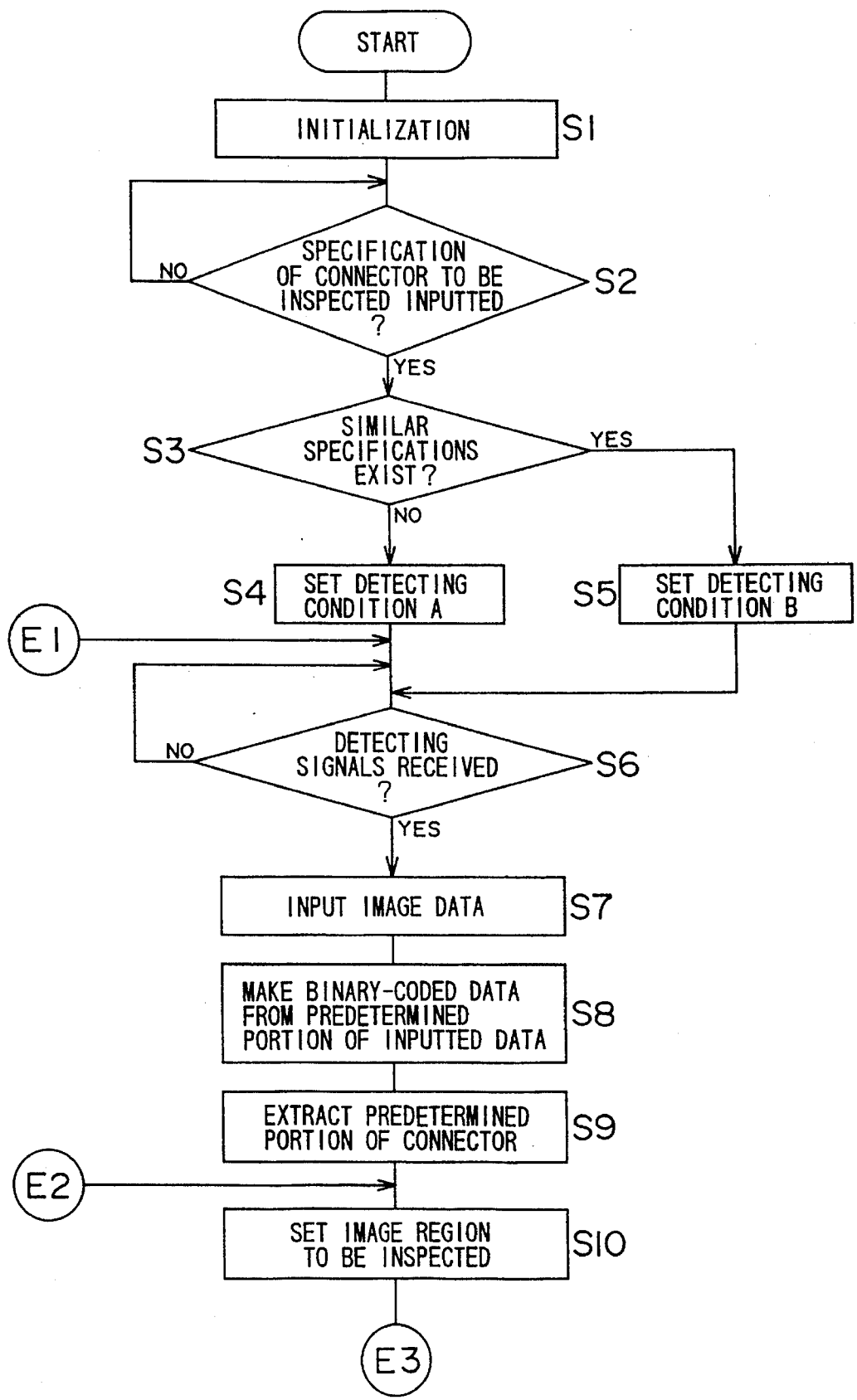
FIG. 9 is a flow chart showing processing for judging whether the connector is accepted or rejected which is performed by a computer.
Figure 10:
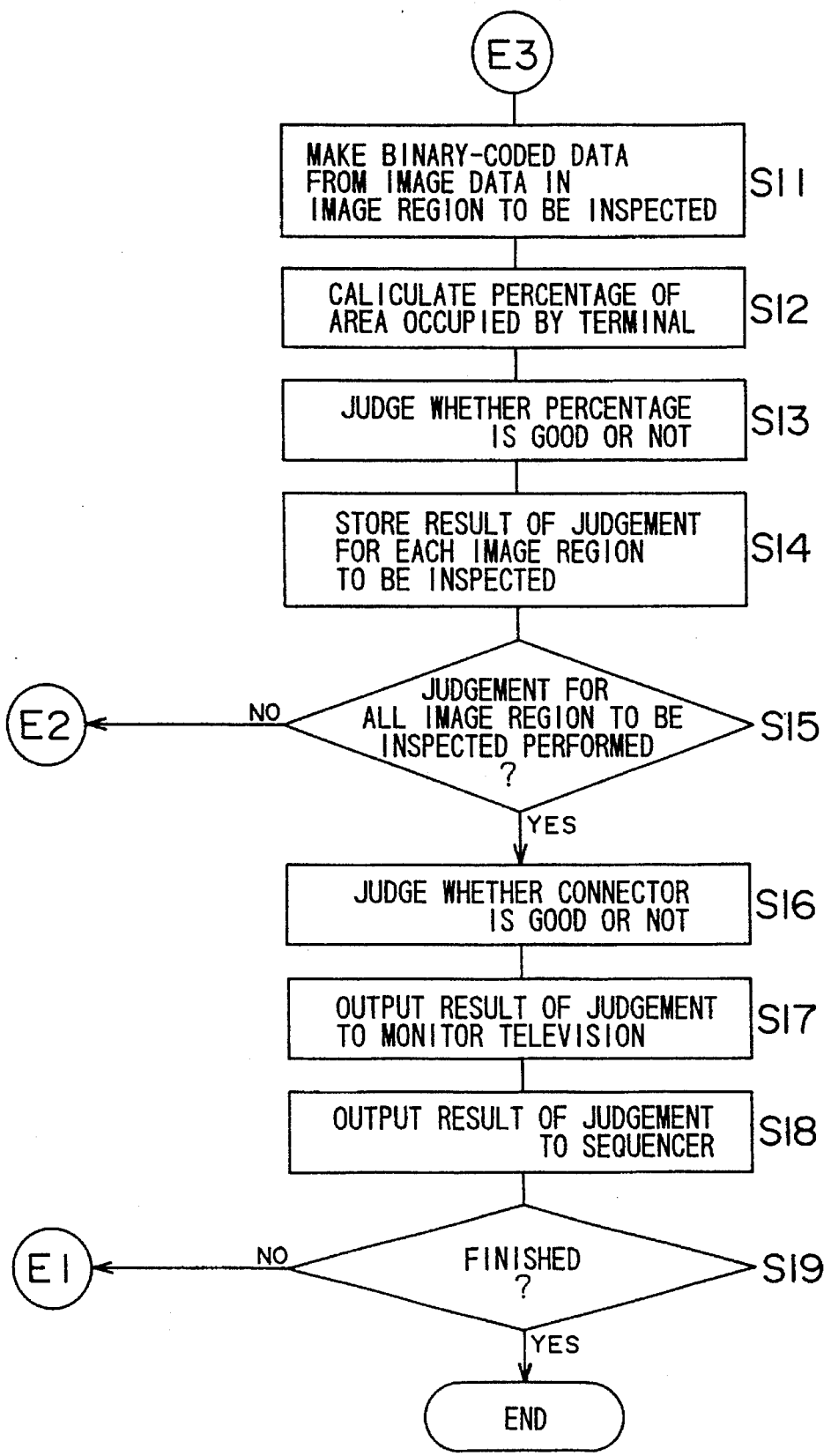
FIG. 10 is a flow chart showing processing subsequent to the processing in the flow chart of FIG. 9.

Description is now made of the flow of control of the computer 80 with reference to flow charts of FIGS. 9 and 10.

If the inspecting device is started, initialization such as memory clear is performed (step S1). If the specifications of the connector C to be inspected are inputted through the keyboard KB (step S2), inspection conditions A or B including image regions to be inspected (Q2, Q4, . . . in FIG. 7), the order of processing of the image regions Q2, Q4, . . . , and judgment conditions in each of the image regions Q2, Q4, . . . are set in response to the input on the basis of the data previously stored in the ROM (steps S4 and S5).

In the setting of the above described inspection conditions, it is judged whether or not there exist specifications similar to the inputted specifications in the step 3. The inspection conditions A are set if the similar specifications do not exist, while the inspection conditions B are set if the similar specifications exist. In the inspection conditions A, image regions (image regions Q1 and Q3 in FIG. 7) associated with the terminal containment holes C2b each set so as to avoid containing a terminal are excluded from the order of processing.

On the other hand, in the inspection conditions B, the image regions (Q1 and Q3 in FIG. 7) associated with the terminal containment holes C2b each set so as to avoid a containing terminal are set as image regions to be inspected, and judgment conditions that it is accepted that no terminals T are contained are set in the above described image regions associated with the terminal containment holes C2b each set so as to avoid containing a terminal.

If the connector C is set on the mounting plate 20 along the above described cursors 31 and 33, the connector C is detected by the connecting element detecting sensors S1 to S4, the light irradiating device 50, the television camera 70 and the like are started by the computer 80 receiving detection signals, and an image signal obtained by imaging using the television camera 70 is inputted as image data converted into a digital signal (steps S6 to S7). At this time, the image signal is also inputted to the VTR 100.

A predetermined portion of the inputted image data is binary-coded (step S8), one external shape contour segment CL of the housing CH of the connector C, for example, is extracted on the basis of the binary-coded data (step S9), and a plurality of image regions to be inspected Q2, Q4, . . . are set on the basis of the coordinates of the contour segment CL (step S10).

Each of the image regions Q2 and Q4 to be inspected is then binary-coded for each pixel (step S11), one region to be inspected is divided into a portion occupied by the terminal and the remaining portion on the basis of the binary-coded data, and the number of pixels in the portion occupied by the terminal is compared with the number of pixels in the entire region to be inspected to find the percentage of the area of the portion occupied by the terminal (step S12). The found percentage is compared with the above described judgment conditions to judge whether or not the percentage satisfies the judgment conditions for each image region to be inspected (step S13), and the result of the judgment is stored in the RAM (step S14).

Processing in the steps S10 to S13 is performed with respect to all image regions to be inspected, to terminate all processing with respect to all the image regions to be inspected Q2, Q4, . . . (step S15). If any one of the results of the judgment for the regions to be inspected Q2, Q4, . . . is bad, it is judged that the connector C is rejected (step S16). The result of the judgment and information related thereto are outputted to the monitor television 90 (step S17), and the result of the judgment of the connector C is outputted to the sequencer 130 (step S18). So long as the specifications are not changed, the inspecting device waits until the connector C is subsequently set (step S19 and step S6).

According to the present embodiment, the inspection is made by an image without coming in contact with the terminals T, thereby to make it possible to make the inspection efficiently and with high precision without damaging the terminals T. It is also possible to detect a half-inserted state, which cannot be detected particularly in the conventional method of checking the conduction by bringing a conductor into elastic contact with the terminals. Moreover, the inspecting method according to the present invention is also applicable to a small-sized and multipolar connector C and has wide applicability.

Furthermore, if the specifications of the connector C to be inspected are inputted from the keyboard KB, processing conditions corresponding to the specifications are automatically set, thereby to make it possible to make the inspection more efficiently.

Particularly when the inputted specifications are specifications including the terminal containing holes C2b each set so as to avoid containing a terminal, the processing of the terminal containment holes C2b each set so as to avoid containing a terminal is omitted, thereby to make it possible to improve the processing speed as a whole. Moreover, in this case, it is confirmed that no terminals are contained in the terminal containment holes C2b each set so as to avoid containing a terminal under the condition that there exist similar specifications which differ only in that the terminals T are contained in the terminal containment holes C2b each set so as to avoid containing a terminal. Consequently, it is possible to reliably prevent the specifications from being mistaken for the similar specifications.

Additionally, regions each sufficiently narrow to find the percentage of the area of the terminal T which is a part of the terminal containing hole are set as image regions Q2, ... to be inspected, thereby to make it possible to improve the processing speed to make the inspection more efficiently.

Furthermore, the coordinates of the image regions to be inspected Q2, ... are set on the basis of the contour segment CL of the extracted connector C, thereby to make it possible to further improve the inspection precision.

Additionally, the positional relationship between the light irradiating section 53 and the television camera 70 is so set that the television camera 70 can avoid regular reflected light from the connecting surface C1. Binary-coding processing is performed using diffused reflected light, thereby to make it possible to reliably grasp the contrast of the lightness. As a result, it is possible to reliably determine that the connecting element is rejected, for example, the terminals are not properly mounted.

Furthermore, it is possible to visibly verify the result of the judgment easily by the monitor television 90. Moreover, an inferior portion is displayed in an image of the connector C, thereby to make it possible to easily verify the inferior portion by the monitor television 90.

Figure 11:
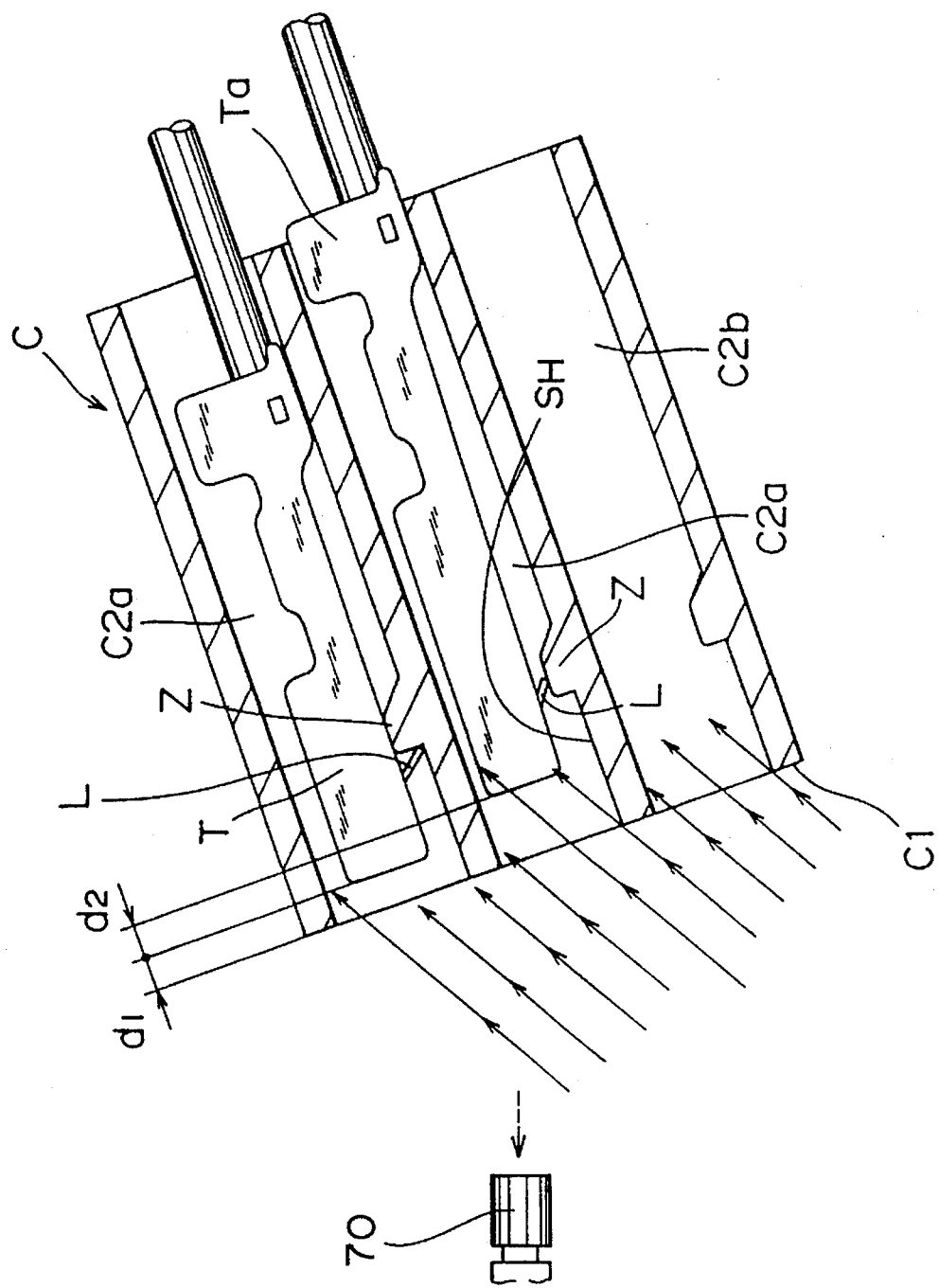
FIG. 11 is a schematic view showing a television camera and a connector in a connecting element inspecting device according to another embodiment of the present invention.

The present invention is not limited to the above described embodiment. As shown in FIG. 11, the television camera 70 can be also provided in the position where the light irradiating device 50 can image a shadow portion SH formed within the terminal containing hole C2. In this case, the contrast of the lightness can be obtained more clearly between a portion of the terminal T and the shadow portion SH on the inner surface of the terminal containing hole C2, thereby to make it possible to more reliably determine that the connector C is rejected, for example, the terminal C is not properly mounted.

Additionally, the present invention is applicable to another connecting element such as a socket.

Furthermore, it is also possible to simultaneously inspect a plurality of connecting elements using a plurality of television cameras 70.

Although in the above described embodiment, the specifications of the connecting element are inputted using the keyboard KB, the specifications can be also inputted by reading a bar code attached to the surface of the connecting element using a bar code reader.

Although in the present embodiment, the shift in the position is corrected utilizing a contour segment as a basis, a pair of projections (or holes) can be previously provided on the connecting surface C1 to correct the shift in the position utilizing the positions of both the projections (or the holes) as a basis.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connecting element inspecting method for inspecting a connecting element having i) a connecting surface to face a connector to be paired with the connecting element, ii) a plurality of terminal containing holes opening to said connecting surface, and iii) terminals respectively inserted into predetermined terminal containing holes in a predetermined direction of insertion and contained therein, comprising the steps of:

inputting image data of said connecting surface obtained using light reflected in a direction intersecting said predetermined direction of insertion from said connecting surface;

setting an image region to be inspected in relation to a predetermined terminal containing hole to be inspected on the basis of said image data;

calculating a percentage of the area of a portion occupied by the terminal in said image region to be inspected; and judging whether said connecting element is accepted or rejected in relation to said predetermined terminal containing hole to be inspected depending on whether or not said percentage satisfies predetermined judgment conditions which judgment conditions include a rejection determination when a terminal is only partially inserted within said predetermined terminal containing hole.

2. The connecting element inspecting method according to claim 1, further comprising, before said step of calculating a percentage of the area of a portion occupied by the terminal, the step of obtaining binary-coded information for each pixel of said image region to be inspected, and in said step of calculating a percentage of the area of a portion occupied by the terminal, said percentage being calculated on the basis of a comparison between the number of pixels in the portion occupied by the terminal and the number of pixels in the remaining portion in said image region to be inspected.

3. The connecting element inspecting method according to claim 2, wherein in said step of inputting image data, diffused reflected light is used as said reflected light.

4. The connecting element inspecting method according to claim 2, wherein in said step of inputting image data, said reflected light includes a shadow portion formed within said terminal containing hole.

5. The connecting element inspecting method according to claim 1, further comprising, before said step of setting an image region to be inspected, the step of extracting from said image data image data corresponding to a predetermined characteristic portion of said connecting element, and in said step of setting an image region to be inspected, said image region to be inspected being set on the basis of the image data corresponding to said characteristic portion.

6. The connecting element inspecting method according to claim 1, wherein in said step of setting an image region to be inspected, said image region to be inspected is set to a region narrower than the whole of an image portion corresponding to said predetermined terminal containing hole to be inspected and a region where a shift in the position of the terminal can be detected.

7. The connecting element inspecting method according to claim 1, further comprising, after said step of judging whether the connecting element is accepted or rejected, the step of outputting information related to the result of the judgment of said connecting element.

8. The connecting element inspecting method according to claim 7, wherein in said step of outputting information related to the result of the judgment, said information related to the result of the judgment is outputted to image receiving means for outputting an image of said connecting element.

9. The connecting element inspecting method according to claim 8, wherein said information related to the result of the judgment includes an indication that the terminal containing hole to which the terminal whose percentage does not satisfy said predetermined judgment conditions is inputted is rejected, in said step of outputting information related to the result of the judgment, said indication that the terminal containing hole is rejected being displayed in a portion, which corresponds to the terminal containing hole to which the terminal whose percentage does not satisfy said predetermined judgment conditions is inputted, of an image of the connecting element outputted to said image receiving means.

10. The connecting element inspecting method according to claim 1, further comprising, before said step of inputting image data, the step of setting inspection conditions depending on the specifications of the connecting element to be inspected.

11. The connecting element inspecting method according to claim 10, wherein said inspection conditions include image regions respectively associated with the plurality of terminal containing holes in which the terminals are to be contained in said connecting element to be inspected, the order of processing of the image regions, and judgment conditions in each of the image regions.

12. The connecting element inspecting method according to claim 11, wherein in said step of setting inspection conditions, said inspection conditions are so set that when the connecting element to be inspected has specifications including at least one specification wherein a terminal containment hole is to avoid containing a terminal, the image region associated with said terminal containment hole is excluded from the image regions to be inspected.

13. The connecting element inspecting method according to claim 10, wherein in said step of setting inspection conditions, when the connecting element to be inspected has specifications including a specification wherein a terminal containment hole is to avoid containing a terminal, the image region associated with said terminal containment hole is further set as the image region to be inspected, and judgment conditions in the image region associated with the terminal containment hole are so set that it is accepted that no terminal is contained under the condition that there exists another connecting element having similar specifications which differ only in that the terminal is contained in said terminal containment hole.

14. The connecting element inspecting method according to claim 5 wherein said characteristic portion is an external shape contour segment of a housing of said connecting element.

15. The connecting element inspecting method according to claim 6 wherein the narrower region to be inspected is a central portion of said predetermined terminal containing hole so as to exclude two side portions of the terminal containing hole.

16. The connecting element inspecting method as recited in claim 1 wherein prior to inputting image data, a camera and light source are adjusted such that an acute angle is formed between a central axis of a light emitting portion of said light source and a central axis of a light receiving portion.

17. The connecting element inspecting method as recited in claim 1 wherein inspecting the connecting element includes inspecting a connecting element having independent terminal supports joined to respective end portions of said terminals.

18. The connecting element inspecting method as recited in claim 17 wherein said independent terminal supports are electric wires.

19. A connecting element inspecting device for inspecting a connecting element having i) a connecting surface to face a connector to be paired with the connecting element, ii) terminal containing holes opening to the connecting surface, and iii) terminals respectively inserted into the predetermined terminal containing holes in a predetermined direction of insertion and contained therein, comprising:

light irradiating means for irradiating said connecting surface to said connecting element by parallel light entering the terminal containing holes;

imaging means so disposed that light reflected in a direction intersecting said predetermined direction of insertion from said connecting surface can be received for imaging said connecting surface using said reflected light;

image region setting means for setting an image region to be inspected in relation to a predetermined terminal containing hole to be inspected on the basis of image data from said imaging means;

percentage calculating means for calculating the percentage of the area of a portion occupied by the terminal in said image region to be inspected; and judging means for judging whether said connecting element is accepted or rejected in relation to said predetermined terminal containing hole to be inspected depending on whether or not said percentage satisfies predetermined judgment conditions which judgment conditions include a rejection determination when a terminal is only partially inserted within said predetermined terminal containing hole.

20. The connecting element inspecting device according to claim 19, further comprising binary-coding means for obtaining binary-coded data for each pixel from the image data from said imaging means, said percentage calculating means calculating said percentage on the basis of a comparison between the number of pixels in the portion occupied by the terminal in said image region to be inspected and the number of pixels in the remaining portion using the binary-coded data for each pixel in the image region to be inspected.

21. The connecting element inspecting device according to claim 20, wherein the positional relationship between said light irradiating means and said imaging means is so set that said imaging means can avoid input of regular reflected light from said connecting surface.

22. The connecting element inspecting device according to claim 21, wherein said imaging means is provided in the position where said light irradiating means can image a shadow portion formed within said predetermined terminal containing hole to be inspected.

23. The connecting element inspecting device according to claim 19, further comprising characteristic portion extracting means for extracting image data corresponding to a predetermined characteristic portion of said connecting element from the image data from said imaging means, said image region setting means setting said image region to be inspected on the basis of the image data corresponding to said characteristic portion.

24. The connecting element inspecting device according to claim 19, wherein said image region to be inspected is set to a region narrower than the whole of an image portion corresponding to said predetermined terminal containing hole to be inspected and a region where a shift in the position of the terminal can be detected.

25. The connecting element inspecting device according to claim 19, further comprising outputting means for outputting information related to the result of the judgment by said judging means.

26. The connecting element inspecting device according to claim 25, wherein said outputting means comprises image receiving means for outputting an image of said connecting element imaged by said imaging means and information related to the result of the judgment by said judging means.

27. The connecting element inspecting device according to claim 26, wherein said information related to the result of the judgment includes an indication that the terminal containing hole to which the terminal whose percentage does not satisfy said predetermined judgment conditions is inputted is rejected, said indication being displayed in a portion, which corresponds to the terminal containing hole to which the terminal whose percentage does not satisfy said predetermined judgment conditions is inputted, of the image of the connecting element outputted to said image receiving means.

28. The connecting element inspecting device according to claim 19, further comprising specification inputting means for inputting the specifications of said connecting element to be inspected, and inspection condition setting means for setting predetermined inspection conditions depending on the inputted specifications of the connecting element.

29. The connecting element inspecting device according to claim 28, wherein said predetermined inspection conditions include image regions respectively associated with the plurality of terminal containing holes in which the terminals are to be contained in said connecting element to be inspected, the order of processing of the image regions, and judgment conditions in each of the image regions.

30. The connecting element inspecting device according to claim 29, wherein said inspecting condition setting means sets said predetermined inspecting conditions so that when said connecting element to be inspected has specifications including a specification wherein a terminal containment hole is to avoid containing a terminal, the image region associated with said terminal containment hole is excluded from said image region to be inspected.

31. The connecting element inspecting device according to claim 28, wherein when said connecting element to be inspected has specifications including a specification wherein a terminal containment hole is to avoid containing a terminal, said inspection condition setting means further sets the image region associated with said terminal containment hole as said image region to be inspected and sets judgment conditions in the image region associated with the terminal containment hole so that it is accepted that no terminal is contained under the condition that there exists another connecting element having similar specifications which differ from said connecting element to be inspected only in that the terminal is contained in said terminal containment hole.

32. The connecting element inspecting device as recited in claim 23 wherein said characteristic portion is an external shape contour segment of a housing of said connecting element.

33. The connecting element inspecting device according to claim 24 wherein the narrower region to be inspected is a central portion of said predetermined terminal containing hole so as to exclude two side portions of the terminal containing hole.

34. The connecting element inspecting device as recited in claim 19 wherein said light irradiating means includes a light source which is supported on a support structure such that said light source is pivotable about a first axis and adjustable along both a second and a third axis, and said imaging means includes a camera which is supported on a camera supporting structure such that said camera is pivotable about said first axis and adjustable in a direction along said second and third axis.

35. The connecting element inspecting device as recited in claim 19 wherein said judgment means judges whether terminals joined with independent electric wires are partially or completely received within said terminal containing holes.

* * * * *